United States Patent [19]
Love

[11] Patent Number: 5,831,847
[45] Date of Patent: Nov. 3, 1998

[54] POWER SUPPLY WITH SEPARATED AIRFLOWS

[75] Inventor: David Ross Love, Randolph, N.J.

[73] Assignee: Jerome Industries Corp., Elizabeth, N.J.

[21] Appl. No.: 804,463

[22] Filed: Feb. 5, 1997

[51] Int. Cl.$^6$ .................................................. H02M 1/00
[52] U.S. Cl. ........................................ 363/141; 361/695
[58] Field of Search ............................ 363/141; 361/687, 361/695, 697

[56] References Cited

U.S. PATENT DOCUMENTS

| | | | |
|---|---|---|---|
| 4,035,711 | 7/1977 | Piller | 363/141 |
| 5,170,336 | 12/1992 | Getter et al. | 363/141 |
| 5,235,491 | 8/1993 | Weiss | 363/141 |
| 5,424,915 | 6/1995 | Katooka et al. | 361/695 |
| 5,484,012 | 1/1996 | Hiratsuka | 361/695 |
| 5,725,622 | 3/1998 | Whitson et al. | 361/695 |

*Primary Examiner*—Stuart N. Hecker
*Attorney, Agent, or Firm*—Thomas L. Adams

[57] ABSTRACT

A power supply adapted to be driven by a primary power source to produce an output voltage. The supply has a case with a bottom wall, an air inlet, an air outlet, and an enclosed chamber bordered by the bottom wall, the air inlet and the air outlet. The bottom is adapted to rest on a horizontal surface to define an upward direction within the case. The air inlet is operable to deliver air into the case along an incoming passageway having components directed inwardly and upwardly to prevent liquid that falls atop the case from intruding into the case. A power converter mounted in the case is adapted to be connected to the primary power source for producing the output voltage. The power supply also has a fan mounted in the case between the air inlet and the air outlet for providing a separated pair of airflows downstream and upstream of the fan. The pair of airflows pass across different portions of the power converter. The power supply also has a principal bulwark mounted in the case for (a) dividing the chamber, (b) supporting the fan, and (c) impeding bypassing of the fan.

52 Claims, 4 Drawing Sheets

POWER SUPPLY WITH SEPARATED AIRFLOWS

BACKGROUND OF THE INVENTION

1. Field of the Invention

The present invention relates to power supplies and, in particular, to convection cooling of a power supply by means of a fan.

2. Description of Related Art

Known power supplies can convert an A.C. voltage into a D.C. voltage by using a transformer/rectifier. The output voltage can be regulated with various known techniques. One class of power supplies has miniature, plastic encased units that produce 96 watts of D.C. output power at various voltages from 5 to 48 volts. The A.C. input to the power supplies can be anywhere from 90 VAC to 260 VAC (50/60 Hz) and the output power can remain tightly regulated (±0.1%).

One type of power supply uses a full wave bridge to produce a pulsating unidirectional current to charge a capacitor in a primary circuit. The voltage on the capacitor can be applied in pulses to the primary of a power transformer through a high speed semiconductor switch. This high frequency chopping will reduce the size of the transformer core and the overall transformer size. The secondary output from the transformer can then be rectified and filtered to produce an output voltage. This output voltage can be regulated by a control circuit that modifies the duty cycle (pulse width modulation) of the high frequency switch in the primary circuit.

Relatively large amounts of power can be dissipated in the rectifiers and high frequency power switches of the various types of power supplies. Consequently, special efforts are made to cool these power devices to prevent their overheating and destruction. Typical techniques for cooling such devices include mounting the device in good thermal contact with a heat sink, typically a metal plate having a large surface area that may be enhanced by cooling fins. The cooling of the devices can also be enhanced by a running a fan that is mounted inside the case containing the power supply.

Known cooling fans have been mounted adjacent to a relatively large opening in the power supply case. This opening is typically the same diameter as the outside diameter of the fan blade. Such a large opening presents a problem should liquid accidentally spill, drip or otherwise fall upon the power supply case. Liquid would have a tendency to flow into the power supply case, causing damage. Protection against dripping or spills can be very important in certain applications, especially when the power supply is used to power medical electronics.

In some embodiments of the prior art, a fan was regulated by a thermistor that responded to high temperature inside the power supply case. A disadvantage with that type of fan control is the delay associated with a build-up of interior temperature. Also, the positioning of the temperature sensing thermistor becomes critical so that the temperature of the vulnerable components is quickly and reliably obtained. Therefore, the thermistor must often be mounted for temperature sensing purposes, in an inconvenient location, and then connected to a remote fan control circuit. This can be extremely difficult where the temperature of the primary circuit is to be sensed and used to control a fan that may be powered by a secondary circuit.

Louvers have often been mounted adjacent to a fan for a dwelling in order to guide the fan's airflow and also to shield the fan from rain.

In U.S. Pat. No. 5,440,450 a housing for a personal computer has rear air inlets that bring air across certain components inside the case before reaching a fan that is mounted on a lower opening on the case. This lower opening is tilted somewhat from the horizontal and communicates with a recess in the underside of the case that provides an air channel that flows under the computer power supply. The device does not employ bulwarks to divide the power supply circuitry into a number of air chambers. A disadvantage with this case is the large amount of volume required for the discharge air channel that flows under the power supply. Furthermore, the air inlets are not designed to prevent liquid spills from intruding into the case.

In U.S. Pat. No. 5,393,961 a fan mounted in the lower portion of a microwave heating device draws air in through vents on the underside of the device. The air is discharged through a series of louvers on the side of the device. The illustrated fan is mounted effectively adjacent to the inlet and, therefore, does not take advantage of the upstream airflow into the fan for any cooling purposes. Also, the fan is mounted in a fashion to promote bypassing of the fan. Also, the air inlet is placed on the underside of the casing. While positioning the inlet on case underside may reduce intrusion from spills, it requires ample space under the case for supporting an airflow, otherwise the incoming airflow will still be impeded. Providing a large space between the support surface and the underside of the case greatly increases the volume consumed by the device.

The D.C. to A.C. inverter of U.S. Pat. No. 5,170,336 shows a fan 68 mounted adjacent to an air inlet 66 on the side of the case. In one embodiment a supplementary fan is mounted to the outside of an air outlet on the lower wall of the main casing, but inside a lower duct located below the main casing. This duct exhausts air past rear cooling fins of a heat sink but also circulates air back into the main casing through the transformer. Both fans are mounted adjacent to openings in the main casing and, therefore, do not have upstream and downstream paths for cooling, except that the lower fan does support two cooling paths to the extent it promotes recirculation. Also, the main fan is not protected from spills. While the supplementary fan is shielded inside the lower duct, this duct consumes significant amounts of space.

U.S. Pat. No. 5,428,267 shows a fan mounted to the outside of a chassis without any spill protection.

U.S. Pat. No. 5,288,961 shows a magnetron mounted at one end of a housing with a fan mounted on a wall of the housing. A transformer is mounted between the magnetron and the fan. This reference does not disclose any specialized vents for avoiding liquid intrusion from spills. Also, the reference does not disclose any bulwarks supporting the fan and dividing the housing.

U.S. Pat. No. 4,100,463 shows an assembly containing a magnetron power supply and a fan. The horizontal air inlets and air outlets expose the internal electrical components to intrusion from spills. The power supply is contained in a compact compartment upstream of the fan. Also, the fan is mounted on a sidewall not a bulwark that could prevent air form bypassing the fan.

See U.S. Pat. No. 4,772,999 for multiple modules that are mounted in a cubicle containing a single cooling fan. See also U.S. Pat. Nos. 5,436,427; 5,323,099; 5,127,464; 4,949,233; 4,694,140; 4,142,091; 3,829,740; 3,641,419; and 3,586,915.

SUMMARY OF THE INVENTION

In accordance with the illustrative embodiments demonstrating features and advantages of the present invention, there is provided a power supply adapted to be driven by a primary power source to produce an output voltage. The power supply has a case with an air inlet and an air outlet. Also included is a converter means mounted in the case and adapted to be connected to the primary power source for producing the output voltage. The power supply also has a fan mounted in the case between the air inlet and the air outlet for providing a separated pair of airflows downstream and upstream of the fan. The pair of airflows pass across different portions of the converter means.

According to another aspect of the present invention a power supply adapted to be driven by a primary power source to produce an output voltage has the same converter means. The power supply has a case with a lower wall, an air inlet, an air outlet, and an enclosed chamber bordered by the lower wall, the air inlet and the air outlet. Also included is a fan mounted in the case between the air inlet and the air outlet for providing a pair of airflows downstream and upstream of the fan. The power supply also includes a principal bulwark mounted in the case for (a) dividing the chamber, (b) supporting the fan, and (c) impeding bypassing of the fan.

According to still another aspect of the present invention a power supply adapted to be driven by a primary power source to produce an output voltage, has the same converter means. The power supply has a case with an air inlet, an air outlet, a top and a bottom adapted to rest on a horizontal surface to define an upward direction within the case. The air inlet is operable to deliver air into the case along an incoming passageway at an acute angle to horizontal having components directed inwardly and upwardly to prevent liquid that falls atop the case from intruding into the case. Also included is a fan mounted in the case between the air inlet and the air outlet for providing a pair of airflows downstream and upstream of the fan.

By employing apparatus of the foregoing type, an improved power supply is achieved. In a preferred embodiment, the power supply is contained in a case having a plurality of parallel slots that provide an angled air flow. For example, the air inlets provide an incoming passageway that is slanted inwardly and upwardly. This slant can prevents liquid that drips, spills or otherwise falls upon the case from intruding into the case.

Also, a fan is preferably mounted inside the case at a distance remote from the air inlets and air outlets. This reduces noise, protects the fan and avoids liquid from being sucked in through the air inlets. In a preferred embodiment, the fan is positioned closer to the outlet than the inlet to guard against liquid intrusion.

In a highly preferred embodiment, the internal fan is mounted on a metal bulwark that also functions as a heat sink. The fan bulwark provides a barrier that prevents air from bypassing the fan and, thus creates an air chamber downstream of the fan. A main power transformer can be mounted on the upstream side of the fan bulwark, while the secondary circuitry of the transformer can be segregated on the downstream side.

In this same embodiment, an auxiliary bulwark can be mounted in the case and spaced from the fan bulwark in an upstream direction. Thus, the interior of the casing is divided into three air chambers. Preferably, the main power transformer is mounted between the bulwarks.

In this preferred embodiment, the auxiliary bulwark can be a heat sink for components in the primary circuit. The bulwark supporting the fan can act as a heat sink for components in the secondary circuit, with the fan itself being connected to the secondary circuit. In addition to this segregation of components mounted on the bulwarks, the secondary circuit is segregated by being located on the downstream side of the fan bulwark. Separating the primary and secondary circuits in this fashion can help prevent shorts across the transformer and can isolate the two circuits to combat electromagnetic interference.

Also in this preferred embodiment, the fan can be switched on and off depending upon the loading of the power supply. Instead of using a temperature sensor such as a thermistor, the preferred embodiment employs a faster acting load sensor. For example, a measurement of high load current from the power supply can be used to turn the fan on. Preferably, the power for the fan is derived directly from the output voltage of the power supply, although in some embodiments an auxiliary secondary winding can be employed to power the fan when the output voltage of the power supply is inappropriate for powering the fan.

Accordingly, power supplies of the foregoing type can combine high efficiencies with novel fan usage configurations to enable the power supply to operate at cool temperatures, thereby extending life of critical componentry, such as capacitors and solid state, semiconductor devices. Also, by making the cooling efficient, components can be mounted with relatively high density, which allows the power supply package to be relatively small.

BRIEF DESCRIPTION OF THE DRAWINGS

The above brief description as well as other objects, features and advantages of the present invention will be more fully appreciated by reference to the following detailed description of presently preferred but nonetheless illustrative embodiments in accordance with the present invention when taken in conjunction with the accompanying drawings, wherein.

DETAILED DESCRIPTION OF THE PREFERRED EMBODIMENTS

Figure 1:
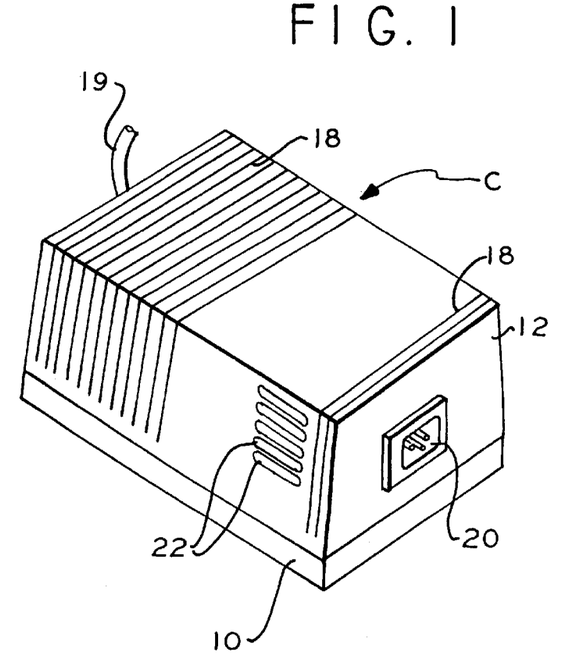
FIG. 1 is a perspective view of a case of a power supply in accordance with the principles of the present invention.
Figure 2:
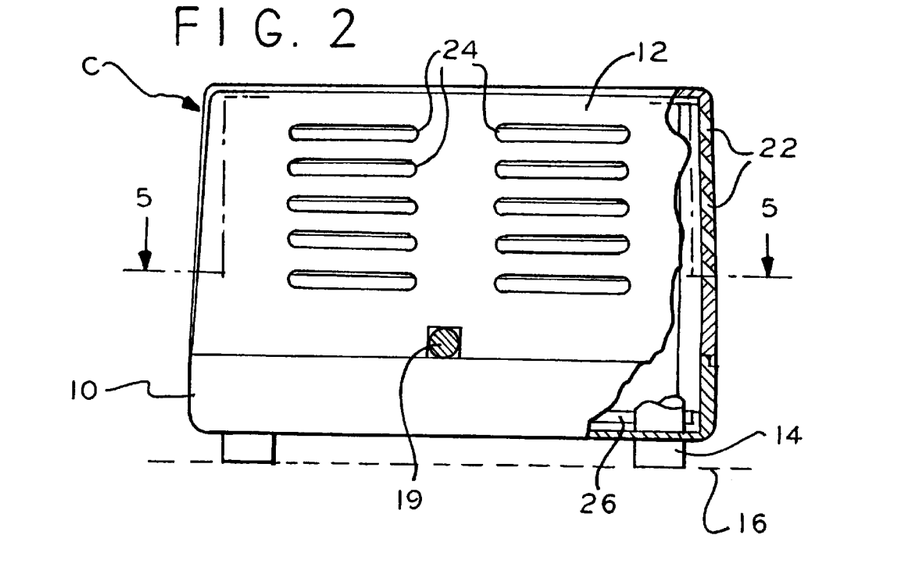
FIG. 2 is an end view of the power supply of FIG. 1.
Figure 3:
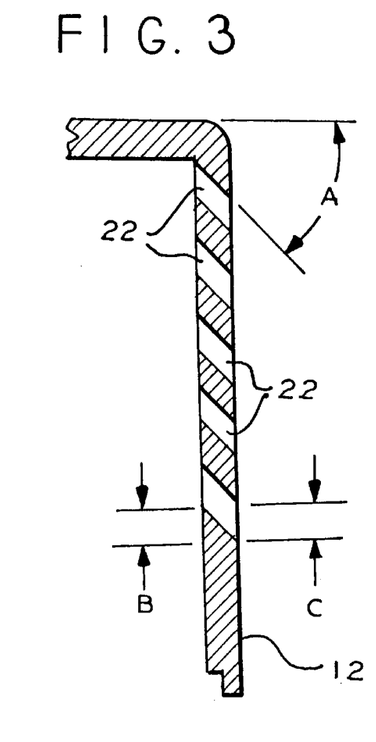
FIG. 3 is a detail sectional view of an upper right portion of the case of FIG. 2.

Referring to FIGS. 1–3, a power supply case C comprises a lower plastic tray 10 fitted with an upper cover 12. Tray 10 forms the bottom of case C and has a rectangular floor surrounded by a relatively short wall whose upper edge is designed to fit with a rabbetted joint to the cover 12. Cover 12 is essentially a five sided, bottomless box. The four sidewalls of cover 12 diverge slightly in a downward direction to provide a draft of 2° to facilitate molding. Tray 10 has a similar draft but in the opposite direction.

While the illustrated case C is approximately parallelepipedal, in other embodiments the case outline can be cylindrical, frustro-ovoidal, various polygonal prisms, etc. Case C is preferably made of plastic, but in other embodiments the case can be formed of metal, various laminates, ceramics, etc. The overall dimensions of case C are 6½ inches (16.5 cm) long, 3 inches (7.6 cm) tall and 3¾ inches (9.5 cm) wide, although other dimensions may be used depending on the capacity of the power supply or other factors.

Case C is designed to rest on four rubber feet 14 onto a horizontal surface 16. A number of parallel decorative ridges 18 are illustrated running along the top of cover 12 and down along the opposing sides of cover 12. A recessed power plug 20 is mounted in one of the end faces of the cover 12. The plug 20 is designed to fit into the socket of a power cord (not shown) that can be connected to an outlet that supplies primary power or house current. The DC output voltage developed by the power supply is conveyed by the cable 19.

An air inlet 22 is shown as a parallel stack of five slots 22 forming incoming passageways. It will be understood that the same number of slots are formed on the opposite side of case 12. Referring to FIG. 2, an air outlet is shown as two columns, each having five parallel stacks of slots 24. Slots 24 form outgoing passageways that may be configured identically to the air inlet slots 22, although differently shaped slots are contemplated for other embodiments.

As shown in FIG. 3, the passageways 22 provide a straight course of ingress at an angle of about 40°, although other angles may be chosen. For example, angle A may be in the range of 25° to 50°. It is desirable to keep the passageways 22 relatively straight to avoid restriction of airflow. It is also desirable to size and angle of passageways 22 so that liquid that drips, spills or otherwise falls upon the top of cover 12 may flow down the side of the case without a tendency to intrude into the interior of the case.

In this embodiment the height C of the passageway 22 measured along a vertical axis is 0.128 inch (3.2 mm), although other heights are contemplated. The vertical rise B of the passageway 22 is 0.096 inch (2.4 mm). Therefore, a small horizontal line of egress exists through the passageways 22. It is desirable to keep the horizontally projected area of the passageways to a minimum to minimize liquid intrusion caused by spilling, dripping or other means. In highly preferred embodiments, the passageway will rise steeply enough to eliminate any completely horizontal path of ingress through the passageways 22.

In some embodiments the slots may be made more slender or shorter. In other embodiments the slots may be replaced with round or square holes that are formed as upwardly sloping tunnels. The size and angle of the air inlets and outlets will vary upon the thickness of the walls of the case, in order to reduce the likelihood of intrusion from liquid dripping, spilling or otherwise falling.

Figure 4:
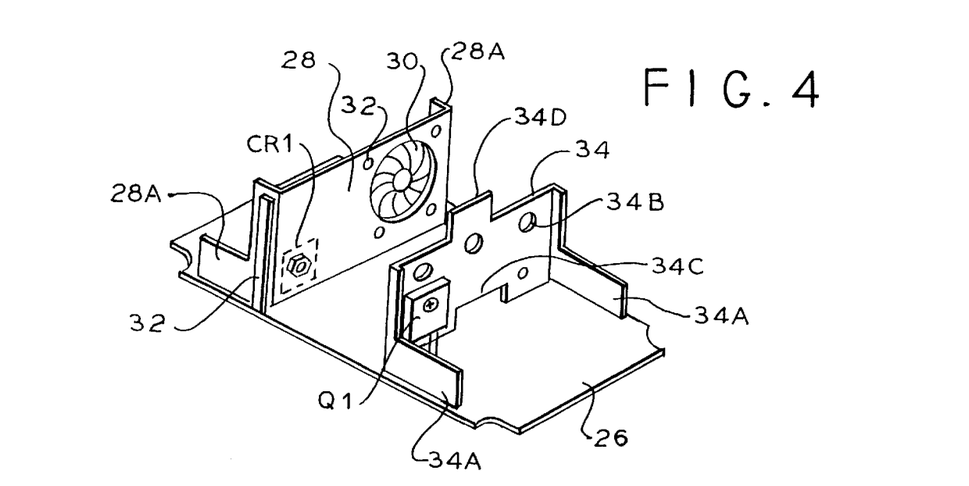
FIG. 4 is a simplified perspective view of the bulwarks and the printed circuit board contained in the power supply case of FIG. 1, but with most of the components on the printed circuit board left unillustrated.

Referring to FIG. 4, a printed circuit board commonly used in electronic circuits is shown in the form of a rectangle with rounded notches formed in each corner. A principal bulwark is shown as an aluminum wall mounted perpendicularly to the printed circuit board 26. The ends of the bulwark 28 are folded at right angles to form a pair of sidewalls 28A that have hand an L-shaped elevational outline.

The main section of bulwark 28 has a circular opening over which a fan 30 is mounted. Fan 30 is attached to bulwark 28 by nuts/bolts 32. Fan 30 may be a compact, low voltage fan that is commonly used to cool electronic circuitry. The CFM rating of fan 30 will be chosen to achieve the desired cooling of the electronics associated with printed circuit board 26. Also, mounting the fan on the inside reduces the noise produced by the power supply.

Bulwark 28 will be made high and wide enough to segregate the case interior into separate air chambers on opposite sides of the bulwark 28. In particular, the top of bulwark 28 will essentially meet the underside of the case cover (cover 12 of FIGS. 1–3). Glued along the full vertical length of sidewalls 28A are a pair of polyurethane foam gaskets 32. Gaskets 32 are designed to provide a seal between the outside edges of bulwark 28 and the inside face of the case cover (cover 12 of FIGS. 1–3). The gasket 32 helps avoid air from bypassing fan 30 and thereby reducing its efficiency.

An auxiliary bulwark 34 is shown as a sheet aluminum wall 34 that is bent along its outside to form a pair of rectangular sidewalls 34A. The sidewalls 34A have an L-shaped elevation outline. The sidewalls 28A (as well as sidewalls 34A) provide additional structural support for the bulwarks as well as additional shielding from electromagnetic interference.

The upper and lower edges of the main section of auxiliary bulwark 34 are stepped by the presence of lower notch 34C and upper tab 34D. This provides passages to allow airflow around the bulwark 34. In addition, three circular holes 34B near the top edge of bulwark 34 support additional airflow past the bulwark. It will be understood that the outline of bulwark 34 can be changed to provide various types of edges and apertures to allow air circulation as desired around the bulwark. These apertures can be arranged to direct the airflow in an upper or lower region and adjust the balance between the airflows in such regions. Also, the auxiliary bulwark 34 can, in some cases, be fabricated from a group of adjacent bulwarks in the same general locality.

Bulwarks 28 and 34 divide the region inside the case into three air chambers: an air chamber to the outside of bulwark 28, a chamber to the outside of bulwark 34, and a chamber between bulwarks 28 and 34. While two bulwarks are illustrated, in other embodiments one bulwark or more than two bulwarks may be employed, depending upon the need to control the airflow or the need for additional heat sinks. Also, the size, thickness and shape of the bulwarks can be varied depending upon the required heat sinking capacity, as well as other space and weight considerations.

Two components requiring conduction cooling are shown herein as primary component Q1 and secondary component CR1, both of which are described further hereinafter. Component Q1 is a power MOSFET semiconductor switch, while component CR1 is a power rectifier. Components CR1 and Q1 are shown bolted in close thermal contact with bulwarks 28 and 34, respectively, so that the bulwarks can act as heat sinks.

Figure 5:
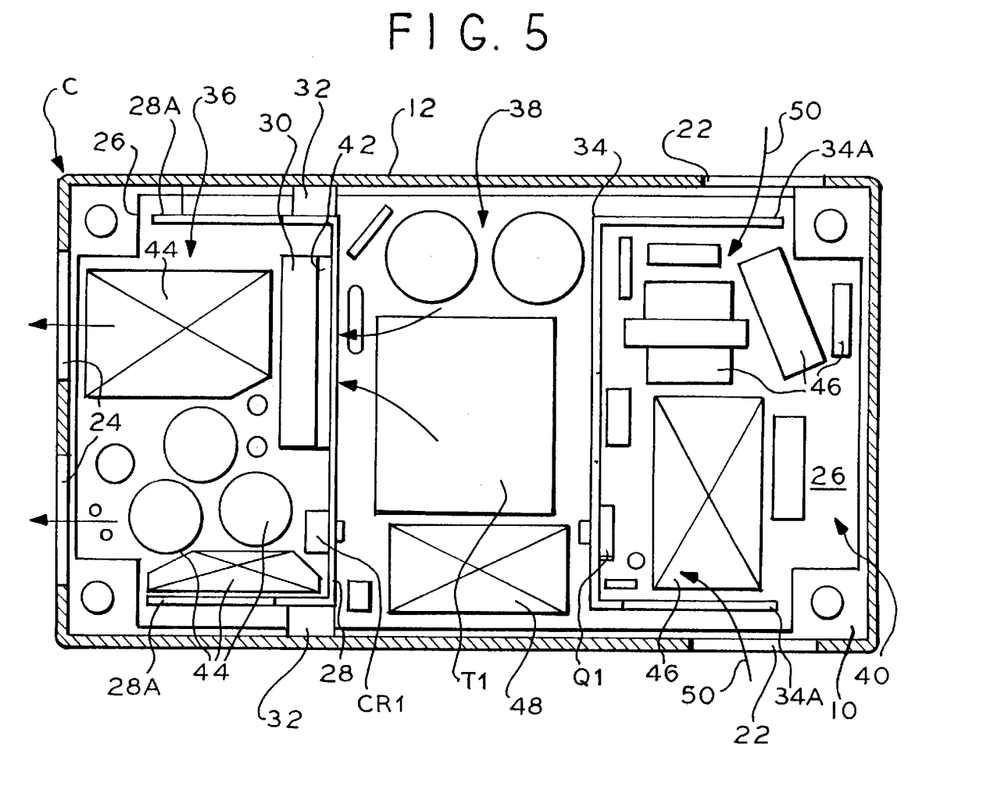
FIG. 5 is a top plan view taken along line 5—5 of FIG. 2 of the power supply.

Referring to FIG. 5, previously mentioned printed circuit board 26 is shown mounted inside case C and resting inside the lower tray 10. In some embodiments a thin foam slab may provide a cushioning support between the circuit board 26 and the floor of tray 10. In still other embodiments the printed circuit board may be secured by screws onto bosses molded into the floor of tray 10.

The interior of case C is shown divided into an air chamber 36 to the outside of principal bulwark 28, an air chamber 38 between bulwarks 28 and 34, and an air chamber 40 to the outside of bulwark 34. Previously mentioned gaskets 32 are shown pressed between the sidewalls 28A and the inside surface of cover 12. Thus, bulwark 28 avoids the bypassing of air around fan 30. Fan 30 is shown mounted to bulwark 28 through a sound absorbing layer 42.

The various polygons and circles illustrated upon the printed circuit board 26 indicate electronic circuitry comprising the converter means described hereinafter. The polygons inscribed with crossed lines generally indicate a plurality of electronic components contained within that region.

The main power transformer T1 is shown mounted between the bulwarks 28 and 34. Transformer T1 has a primary and secondary, as described further hereinafter. This secondary is connected to a secondary circuit 44 that is mounted mainly within air chamber 36, although some of the secondary circuit can be mounted in other regions. The primary circuit 46 associated with transformer T1 is located mainly in the air chamber 40 and in the region 38 between the bulwarks 28 and 34. It is desirable to segregate the secondary circuit 44 in air chamber 36 to reduce coupling between the primary and secondary circuits. The bulwark 28 can then act as an electrostatic shield and can reduce the transfer of electromagnetic interference between the primary and secondary circuit.

It is also advantageous to mount primary components such as switch Q1 on one heat sink (bulwark 34), while mounting secondary components such as rectifier CR1 on a different heat sink (bulwark 28). This isolation reduces the possibility of shorts through a heat sink from primary to secondary. Also, as explained hereinafter, because the fan is powered by the secondary circuit, it is advantageous to mount the fan on a bulwark that is associated with the secondary circuit. This again avoids shorts between primary and secondary.

This isolation also reduces the potential for electromagnetic interference that may travel between the primary and secondary circuits. Suppressing such electromagnetic interference can be particularly important where the power regulation scheme involves a high frequency chopper.

Transformer T1 has a conductive copper foil providing electrostatic shielding between the primary and secondary of the transformer. This decreases electromagnetic interference that can be issuing from the power supply. Still, in some embodiments transformers may not be needed or autotransformers may be used instead, where isolation between input and output is not essential.

Incoming airflows 50 are shown entering case C through air inlets 22 before crossing over the tops of sidewalls 34A. The incoming airflows 50 can then pass over the primary circuitry 46 contained in chamber 40. Thereafter, the airflow passes over and under the stepped edges of auxiliary bulwark 34 to cool transformer T1 and the other circuitry 48 in chamber 38, which is mostly primary circuitry.

Next, the airflow is drawn in through fan 30 and discharged across the circuitry 44 in chamber 36 (mainly secondary circuitry) before being discharged from air outlets 24. It will be noted that the fan 30 is remote from the air outlets 24 and the air inlets 22. This protects fan 30 from damage that might otherwise be caused by liquid infiltration. In particular, the inlet side of the fan 30 is well removed from the air inlets 22 to prevent the fan from drawing liquid into its blades.

The airflow between inlets 22 to the inlet side of fan 30 is referred to as an upstream path length. The airflow from the discharge side of fan 30 to the outlets 24 is referred to as a downstream path length. The downstream path length is as least as long as one quarter of the upstream path length. In fact, in this embodiment, the downstream path length is closer to being about one half the upstream path length.

Figures 6, 7:
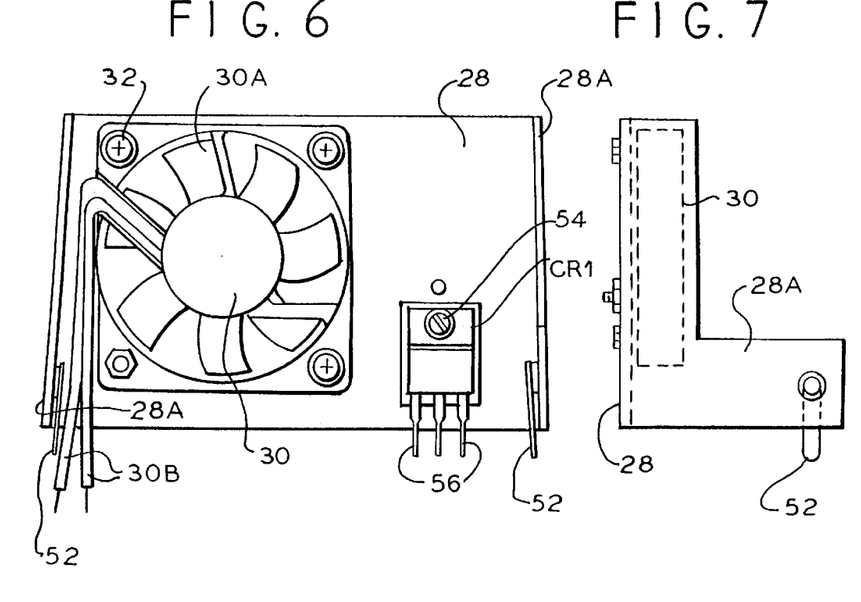
FIG. 6 is an outboard, elevational view of the principal bulwark of FIG. 4.
FIG. 7 is an end view of the principal bulwark of FIG. 6.

Referring to FIGS. 6 and 7, the sidewalls 28A of bulwark 28 are shown to converging slightly in an upward direction to accommodate the draft on the case cover. The fan 30 is shown having a number of blades 30A. The fan frame is shown attached by nuts/bolts 32. Wires 30B are routed from the fan 30 to connect to plated holes on the printed circuit board. Tabs 52 are shown riveted to the inside face of sidewalls 28A to project downwardly and fit into holes in the printed circuit board, where they may be soldered in place.

Previously mentioned rectifier CR1 is shown secured in place by screw 54 to the main wall of bulwark 28. The leads 56 from rectifier CR1 project below the bulwark 28 for insertion and soldering in mating plated holes in the printed circuit board.

Figures 8, 9:
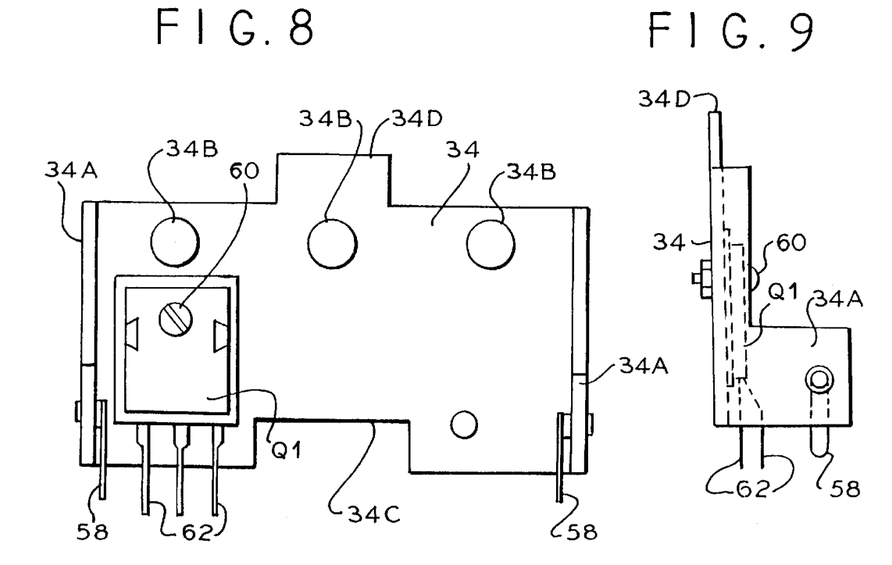
FIG. 8 is an outboard, elevational view of the auxiliary bulwark of FIG. 4.
FIG. 9 is an end view of the auxiliary bulwark of FIG. 8.

Referring to FIGS. 8 and 9, previously mentioned auxiliary bulwark 34 is shown with its upward tab 34D and lower notch 34C, as well as the two sidewalls 34A. In a manner similar to that previously described for the other bulwark, a pair of tabs 58 are riveted to the inside faces of sidewalls 34A to project downwardly and mate with holes in the printed circuit board for subsequent soldering. Previously mentioned semiconductor switch Q1 is shown attached to bulwark 34 by screw 60. The leads 62 of switch Q1 project below the bulwark 34 for insertion and soldering into plated holes in the printed circuit board.

Figure 10:
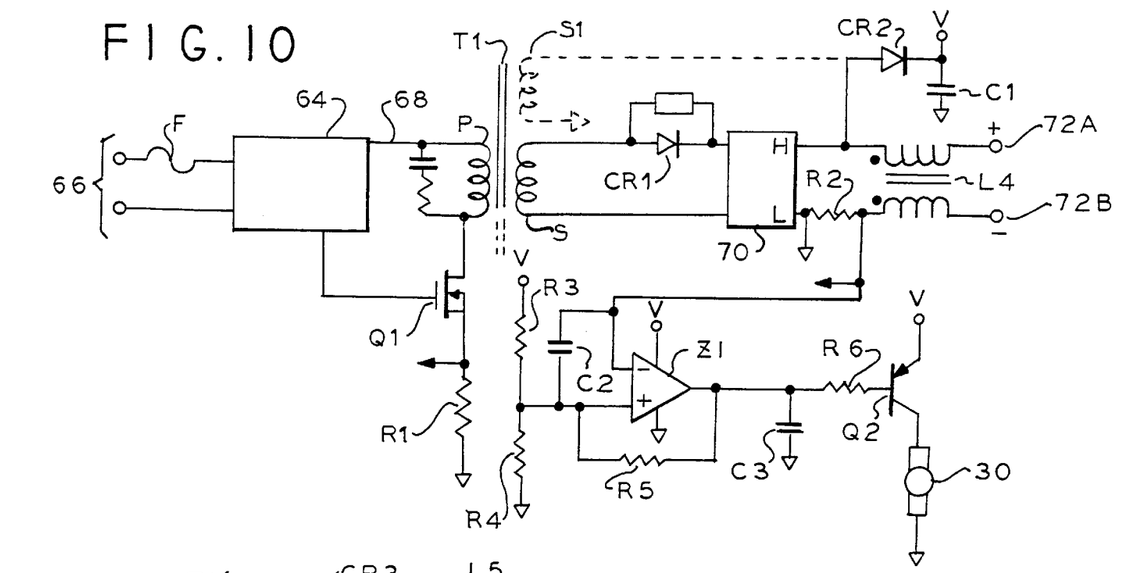
FIG. 10 is a simplified schematic diagram showing the converter means in the power supply of FIGS. 1 and 5.

Referring to FIG. 10, the illustrated converter means is shown as a power supply that can convert an alternating current (A.C.), primary power source 66 into a direct current (D.C.). The illustrated supply is shown as a flyback converter, but other types of converter topologies can be used instead. In this embodiment the primary power 66 is supplied through a fuse F to the converter 64, which contains a full wave rectifier to produce a D.C. voltage on capacitors (not shown) in converter 64. This D.C. voltage is applied to one terminal of primary P of transformer T1, whose other terminal is connected to the source of MOSFET power switch Q1, whose drain is connected through resistor R1 to ground. The gate of transistor Q1 (also referred to as a primary component) is connected back to converter 64.

The circuitry driving the primary P is herein referred to as a primary circuit, while the circuitry driven by secondary S to produce the output voltage on terminal 72A and 72B is herein referred to as a secondary circuit. The primary and secondary circuit operate together as a converter means.

One input of a filtering circuit 70 is connected to one terminal of the secondary S of transformer T1, whose other terminal connects to the anode of previously mentioned rectifier CR1 (also referred to as a secondary component). The cathode of rectifier CR1 connects to another input terminal of filter circuit 70. The output L of filtering circuit 70 is grounded and connects through resistor R2 and one winding of inductive filter L4 to negative output terminal 72B. Resistor R2 is connected in series to sense the output current and thereby act as a serial output element. The output H of filtering circuit 70 connects through another winding of inductive filter L4 to positive output terminal 70A. The output H of filtering circuit 70 also connects to the anode of rectifier CR2, whose cathode is connected across shunt charging capacitor C1, which provides an auxiliary voltage V.

The junction between resistor R2 and inductive means L4 is connected to the inverting terminal of operational amplifier Z1. The non-inverting terminal of amplifier Z1 is connected to the junction of resistors R3 and R4, which are serially connected between voltage V and ground to act as voltage divider. Stabilizing capacitor C2 is connected between the inputs of amplifier Z1.

A positive feedback resistor R5 is connected between the output and non-inverting input of operational amplifier Z1 to provide a certain amount of hysteresis when amplifier Z1 acts a threshold detector. The output of amplifier Z1 is connected to ground through shunting capacitor C3 and to the base of PNP transistor Q2 though resistor R6. Transistor Q2 has its emitter connected to voltage V and its collector connected through fan 30 to ground.

The operational amplifier Z1 connected to resistor R2 together with transistor Q2 and the circuitry supporting transistor Q2 and amplifier Z1 are herein referred to as a controller (transistor Q2 is herein referred to as a control device).

As explained hereinafter, rectifier CR2 charges capacitor C1 to a voltage that can be used to drive the fan circuit. Embodiments where the output voltage from filtering circuit 70 is inappropriate for the fan circuit, the anode of rectifier CR2 may be connected instead to an optional, auxiliary, secondary winding S1, shown herein in phantom.

Figure 11:
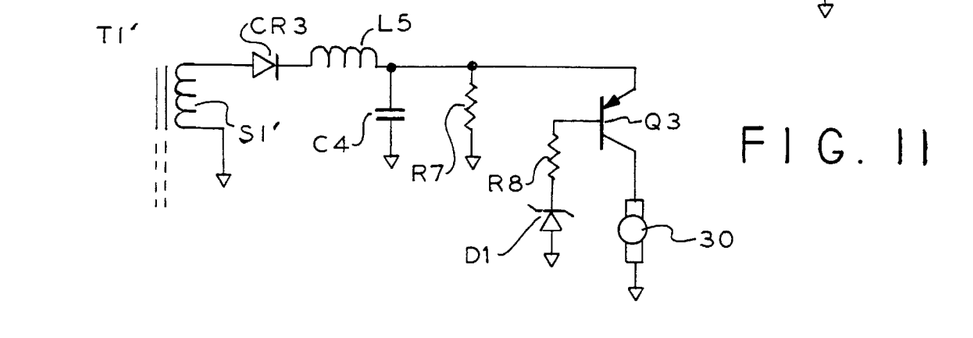
FIG. 11 is a partial schematic illustration of a fan control means that is an alternate of that illustrated in FIG. 10.

Referring to FIG. 11, an alternate circuit is shown for powering the fan 30. In this embodiment an alternate transformer T1' is shown with an auxiliary secondary winding S1'. The balance of the circuitry used to drive fan 30 is referred to as a controller. One terminal of winding S1' is connected to ground and the other terminal is connected to the anode of rectifier CR3, whose cathode connects through inductor L5 to the emitter of PNP transistor Q3. The emitter of transistor Q3 is also connected to ground through the parallel combination of capacitor C4 and resistor R7. Capacitor C4 and inductor L5 act as a filter. The collector of transistor Q3 connects to ground through fan 30. The base of transistor Q3 connects through resistor R8 to the cathode of zener diode D1, whose anode is grounded. Transistor Q3 is also referred to as a control device.

To facilitate an understanding of the principles associated with the foregoing apparatus, its operation will be briefly described. When primary power is applied to terminal 66 the A.C. to D.C. converter 64 produces a D.C. voltage on line 68. At the same time, a pulse train is applied to the gate of transistor Q1. As transistor Q1 switches, primary P is driven by a pulsating current at a relatively high frequency. The duty cycle of the pulse train can be changed to alter the amount of power transferred through transformer T1 in an effort to regulate the output voltage on terminals 72A, 72B. The feedback for the voltage regulation is accomplished through a photodiode/phototransistor pair (not shown). It will be understood that feedback communication through the photodiode/phototransistor pair occurs from sub-system 70 to sub-system 64.

The power conveyed to the secondary S of transformer T1 is rectified by rectifier CR1 and filtered by filter 70. The filtered, regulated D.C. voltage is transferred through series resistor R2 and inductive filter L4 to the output terminals 72A. Positive voltage is also transferred through blocking rectifier CR2 to charge capacitor C1, which supplies the voltage V for the fan circuit.

Voltage V and the output voltage at terminals 72A and 72B are regulated and therefore remain fairly constant. The current delivered to output terminals 72A, 72B will vary significantly with loading. As a result, the voltage drop caused by the varying current flow through resistor R2 will also vary significantly. This voltage drop (related to load current) is applied to the inverting terminal of operational amplifier Z1. When the load current is relatively high, the high positive potential at the inverting terminal is greater in magnitude than the voltage applied to the non-inverting terminal by the voltage divider R3/R4. As a result the operational amplifier produces a low voltage that allows base current to flow through transistor Q2, turning it on. Therefore, collector current flows through fan 30 turning the fan on under these high load circumstances.

If the load across output 72A, 72B decreases, then the voltage drop caused by load current through resistor R2 decreases. With a relatively low voltage applied to the inverting terminal of amplifier Z1, the voltage divider R3/R4 causes amplifier Z1 to produce a relatively high voltage that blocks base current flow through transistor Q2, thereby switching off collector current and de-energizing fan 30. The relatively high potential on the output of amplifier Z1 is fed back through resistor R5 to further increase the positive voltage at the non-inverting input of amplifier Z1. This further increases the threshold to cause hysteresis. This hysteresis is useful when the load current is hovering around the threshold. The fan will not then be subjected to rapid changes in its operating condition.

Accordingly, fan 30 will operate to produce a cooling airflow when the load at output 72A, 72B is relatively high. However, when the load is relatively low, the fan can be turned off to reduce wear. In one preferred embodiment, the output current sensing circuit will turn the fan on and off when the output power level crosses a predefined output threshold, normally defined as 25–50% of full load output power.

In the embodiment of FIG. 11, the auxiliary secondary S1' receives the pulse width modulated power from the primary. This power signal is rectified through rectifier CR3 and filtered by series inductor L5 and shunt capacitor C4. Resistor R7 acts as a continuous load, causing the voltage across capacitor C4 to droop when the duty cycle at secondary S1' is small, as will be the case when there is a light load on transformer T1'. With a relatively small voltage across capacitor C4, there is inadequate voltage across the base-emitter junction of transistor Q3 and across the zener diode D1 to turn transistor Q3 on. Consequently, fan 30 will be off during this light load condition.

When the duty cycle at secondary S1' increases, the voltage across capacitor C4 increases, notwithstanding the load presented by resistor R7. Under these circumstances with increasing voltage, resistor R7 can provide a clear transition between on and off states to avoid soft switching of transistor Q3. When the voltage of capacitor C4 rises sufficiently, the base-emitter junction of transistor Q3 is forwardly biased and current flows through resistor R8 and through zener diode D1. As a result, collector current flows through fan 30 to cause fan operation during the high load operations.

The fan cooling is most desirable under high load conditions when the various components are dissipating the greatest amount of power. In particular, during high load conditions, power switching transistor Q1 (FIG. 10) and secondary rectifier CR1 are passing currents at a high level or duty cycle. To avoid overheating and damage to these components, the cooling fan causes convection that dissipates excessive heat. This convection enhances the conduction cooling produced by the bulwarks 28 and 34, acting as heat sinks.

Referring to FIGS. 4 and 5, when fan 30 is operating air is drawn along paths 50 through the air inlets 22. The incoming air passes over the primary circuit components 46 in chamber 40 to provide convection cooling. In addition, air passes across the surface of bulwark 34 to cool it. This convective cooling is important since previously mentioned power switch Q1 is mounted in thermal contact with bulwark 34, which then acts as a heat sink. Consequently, power switch Q1 has the advantage of both conductive and convective cooling, in order to avoid a build-up of excessive heat and high temperatures that could otherwise damage switch Q1.

Air then passes either under bulwark 34 through notch 34C, over bulwark over 34 through the spaces adjacent to tab 34D, or around bulwark 34 by passing to the outside of sidewalls 34A. In any event, airflow passes into the central chamber 38 to convectively cool the main power transformer T1 and the other primary circuit components 48 contained in compartment 38.

Air can also pass across the surface of bulwark 28 to convectively cool it before entering into the inlet of fan 30. The gaskets 32 insure that all air is directed towards fan 30 with bypassing that would reduce its efficiency and effectiveness. Because of its thermal contact, rectifier CR1 is able to dissipate heat by conduction through bulwark 28, which acts as a heat sink. The air discharged from fan 30 also causes a turbulent airflow inside chamber 36 to cause convective cooling of rectifier CR1, as well as the other components 44 of the secondary circuit. Thereafter, the airflow is discharged through air outlets 24.

Referring to FIGS. 1–3, case C is shown resting on a horizontal surface 16. Therefore, the passageways for air inlet 22 and air outlet 24 are tilted so that liquid falling on top of cover 12 will flow down the sides of the case cover 12 and will not tend to enter the case C. Intruding liquid would need to take an uphill course. An uphill flow is almost ensured by reducing or eliminating any visibility to the horizon from inside the case. Thus, in the end view of FIG. 2 the horizontal projection of the outlets 24 show almost no visibility into the interior of the case C. In effect, there is almost no completely horizontal passageway into the case C. Thus, liquid even propelled along a horizontal path will have difficulty entering the case C.

It is appreciated that various modifications may be implemented with respect to the above described, preferred embodiments. For example, the air inlets and outlets can be positioned at various locations in the case and need not be grouped together in closely arranged stacks. Also the inlets and outlets can be arranged to meet various industry standards defining criteria that must be met to be considered spill proof, drip proof, rain proof, etc. In addition, primary power inlets and D.C. power outlets of various types can be employed. Additionally, the size of the case and the power rating of the power supply can be changed, depending upon the requirements of specific applications. Furthermore, the converter means can convert D.C. voltage to A.C. voltage or to a different magnitude of D.C. voltage. Also, various types of power supplies can be employed to regulate the voltage, in order to provide power factor correction, reduction of electromagnetic interference, etc. Also, the various illustrated semiconductor switches and rectifiers can be replaced with rectifying devices and switching devices of different types.

Obviously, many modifications and variations of the present invention are possible in light of the above teachings. It is therefore to be understood that within the scope of the appended claims, the invention may be practiced otherwise than as specifically described.

I claim:

1. A power supply adapted to be driven by a primary power source to produce an output voltage, comprising:
   a case having an air inlet and an air outlet;
   converter means mounted in said case and adapted to be connected to said primary power source for producing said output voltage;
   a fan mounted in said case between said air inlet and said air outlet for providing a separated pair of airflows downstream and upstream of said fan, said pair of airflows passing across different portions of said converter means; and
   a controller operatively coupled to said fan and said converter means for powering said fan in response to output from said converter means exceeding a predetermined amount.

2. A power supply according to claim 1 wherein said fan is remote from said air inlet and remote from said air outlet.

3. A power supply according to claim 1 wherein said converter means comprises:
   a main power transformer;
   a primary circuit for driving said transformer; and
   a secondary circuit coupled to and driven by said transformer, a portion of said primary circuit being positioned to be cooled by one of said pair of airflows, the other one of said airflows being directed to cool a portion of said secondary circuit.

4. A power supply according to claim 3 wherein a portion of said primary circuit is positioned to be cooled by the upstream one of said pair of airflows.

5. A power supply according to claim 1 wherein said pair of airflows have unequal path lengths, the shorter one of said pair of airflows having a path length at least one quarter that of the longer one of said pair of airflows.

6. A power supply according to claim 1 wherein said controller is operable to power said fan in response to said output voltage being provided from said converter means at a current level exceeding a predetermined threshold.

7. A power supply according to claim 6 wherein said converter means has a serial output element, said controller being operable to power said fan in response to voltage across said serial output element exceeding an amount corresponding to current in excess of said predetermined threshold.

8. A power supply according to claim 1 wherein said controller comprises:
   a control device coupled between said fan and said converter means for supplying power to said fan from said output voltage.

9. A power supply according to claim 1 wherein said controller comprises:
   a auxiliary secondary winding coupled to said fan for supplying power to said fan from said primary power source without using power from the output voltage.

10. A power supply according to claim 9 wherein said auxiliary secondary winding conveys pulse width modulated power, said controller comprising:
    a filter coupled to and driven by said auxiliary secondary winding for providing a control signal; and
    a control device coupled to said filter and to said auxiliary secondary winding for providing power to said fan from said auxiliary secondary winding in response to said control signal.

11. A power supply according to claim 1 wherein said controller is operable to power said fan in response to output from said converter means with some hysteresis.

12. A power supply according to claim 1 wherein said case has a top and a bottom adapted to rest on a horizontal surface to define an upward direction within said case, said air inlet being operable to deliver air into said case along an incoming passageway having components directed inwardly and upwardly to prevent liquid that falls atop said case from intruding into said case.

13. A power supply according to claim 12 wherein said air inlet is directed at an acute angle to said top.

14. A power supply according to claim 12 wherein said air inlet is directed at an acute angle to the top in the range of 25° to 50°.

15. A power supply according to claim 12 wherein said air inlet is arranged to avoid intrusion of liquid spilled atop said case.

16. A power supply according to claim 12 wherein said air inlet is arranged to avoid intrusion of liquid dripped atop said case.

17. A power supply according to claim 12 wherein said air inlet provides at least one straight course of ingress.

18. A power supply according to claim 17 wherein said air inlet lacks a completely horizontal course of ingress.

19. A power supply adapted to be driven by a primary power source to produce an output voltage, comprising:
a case having an air inlet and an air outlet, said case having a top and a bottom adapted to rest on a horizontal surface to define an upward direction within said case, said air inlet being operable to deliver air into said case along an incoming passageway having components directed inwardly and upwardly to prevent liquid that falls atop said case from intruding into said case, said air outlet being operable to discharge air from said case along an outgoing passageway having components directed outwardly and downwardly to prevent liquid that falls atop said case from intruding into said case, said air inlet and air outlet each comprising a stacked plurality of slots;
converter means mounted in said case and adapted to be connected to said primary power source for producing said output voltage; and
a fan mounted in said case between said air inlet and said air outlet for providing a separated pair of airflows downstream and upstream of said fan, said pair of airflows passing across different portions of said converter means.

20. A power supply according to claim 19 wherein said air inlet and said air outlet are laterally positioned to provide an airflow across said converter means with transverse azimuths of ingress and egress.

21. A power supply according to claim 19 comprising:
a principal bulwark mounted in said case for supporting said fan and impeding bypassing of said fan.

22. A power supply according to claim 21 wherein said converter means comprises:
a main power transformer;
a primary circuit for driving said transformer; and
a secondary circuit coupled to and driven by said transformer, a portion of said primary circuit and a portion of said secondary circuit being on opposite sides of said principal bulwark.

23. A power supply according to claim 21 wherein said converter means comprises:
a component requiring conduction cooling mounted on said principal bulwark to conduct heat thereto, so that said principal bulwark acts as a heat sink.

24. A power supply according to claim 23 comprising:
a gasket peripherally mounted alongside said principal bulwark between said principal bulwark and said case.

25. A power supply according to claim 21 comprising:
an auxiliary bulwark mounted in said case, said principal bulwark and said auxiliary bulwark internally dividing said case into three air chambers.

26. A power supply according to claim 25 wherein said principal bulwark and said auxiliary bulwark are electrically isolated.

27. A power supply adapted to be driven by a primary power source to produce an output voltage, comprising:
a case having an air inlet and an air outlet;
converter means mounted in said case and adapted to be connected to said primary power source for producing said output voltage;
a fan mounted in said case between said air inlet and said air outlet for providing a separated pair of airflows downstream and upstream of said fan, said pair of airflows passing across different portions of said converter means;
a principal bulwark mounted in said case for supporting said fan and impeding bypassing of said fan, said converter means comprising:
a main power transformer;
a primary circuit for driving said transformer; and
a secondary circuit coupled to and driven by said transformer, a portion of said primary circuit and a portion of said secondary circuit being on opposite sides of said principal bulwark, airflow from said air inlet crosses most of said primary circuit before crossing most of said secondary circuit.

28. A power supply according to claim 27 wherein airflow from said air inlet crosses most of said primary circuit before crossing said transformer.

29. A power supply according to claim 28 wherein said secondary circuit comprises:
a component requiring conduction cooling mounted on said principal bulwark to conduct heat thereto, so that said principal bulwark acts as a heat sink.

30. A power supply adapted to be driven by a primary power source to produce an output voltage, comprising:
a case having an air inlet and an air outlet;
a fan mounted in said case between said air inlet and said air outlet for providing a separated pair of airflows downstream and upstream of said fan;
a principal bulwark mounted in said case for supporting said fan and impeding bypassing of said fan;
an auxiliary bulwark mounted in said case, said principal bulwark and said auxiliary bulwark internally dividing said case into three air chambers, said principal bulwark and said auxiliary bulwark being electrically isolated; and
converter means mounted in said case and adapted to be connected to said primary power source for producing said output voltage, said pair of airflows passing across different portions of said converter means, said converter means comprising:
a main power transformer;
a primary circuit having a primary component for driving said transformer; and
a secondary circuit having a secondary component coupled to and driven by said transformer, said primary component and said secondary component being mounted on separate ones of said auxiliary bulwark and said principal bulwark for dissipating heat.

31. A power supply according to claim 30 wherein said transformer is mounted between said principal bulwark and said auxiliary bulwark.

32. A power supply according to claim 30 wherein said primary component comprises a power switch, said secondary component comprising a rectifier.

33. A power supply according to claim 30 wherein said primary component comprises a power switch mounted on said auxiliary bulwark, said secondary component comprising a rectifier mounted on said principal bulwark.

34. A power supply adapted to be driven by a primary power source to produce an output voltage, comprising:

a case having an air inlet, an air outlet, a top and a bottom adapted to rest on a horizontal surface to define an upward direction within said case, said air inlet being operable to deliver air into said case along an incoming passageway at an acute angle to horizontal having components directed inwardly and upwardly to prevent liquid that falls atop said case from intruding into said case, said air outlet being operable to discharge air from said case along an outgoing passageway having components directed outwardly and downwardly to prevent liquid that falls atop said case from intruding into said case, said air inlet and said air outlet each comprising a stacked plurality of slots;

converter means mounted in said case and adapted to be connected to said primary power source for producing said output voltage; and a fan mounted in said case between said air inlet and said air outlet for providing a pair of airflows downstream and upstream of said fan.

35. A power supply according to claim 34 wherein said air inlet is directed at an acute angle to said top.

36. A power supply according to claim 34 wherein said air inlet is directed at an acute angle to the top in the range of 25° to 50°.

37. A power supply according to claim 34 wherein said air inlet provides at least one straight course of ingress.

38. A power supply according to claim 37 wherein said air inlet lacks a completely horizontal course of ingress.

39. A power supply according to claim 34 wherein said air inlet is arranged to avoid intrusion of liquid spilled atop said case.

40. A power supply according to claim 34 wherein said air inlet is arranged to avoid intrusion of liquid dripped atop said case.

41. A power supply according to claim 34 wherein said air inlet and said air outlet are laterally positioned to provide an airflow across said converter means with transverse azimuths of ingress and egress.

42. A power supply adapted to be driven by a primary power source to produce an output voltage, comprising:

a case having a lower wall, an air inlet, an air outlet, and an enclosed chamber bordered by said lower wall, said air inlet and said air outlet;

converter means mounted in said case and adapted to be connected to said primary power source for producing said output voltage;

a fan mounted in said case between said air inlet and said air outlet for providing a pair of airflows downstream and upstream of said fan; and a principal bulwark mounted in said case for (a) dividing said chamber, (b) supporting said fan, and (c) impeding bypassing of said fan, said converter means comprising:

a main power transformer;

a primary circuit for driving said transformer; and a secondary circuit coupled to and driven by said transformer, a portion of said primary circuit and a portion of said secondary circuit being on opposite sides of said principal bulwark, airflow from said air inlet crossing most of said primary circuit before crossing most of said secondary circuit.

43. A power supply according to claim 42 wherein said converter means comprises:

a component requiring conduction cooling mounted on said principal bulwark to conduct heat thereto, so that said principal bulwark acts as a heat sink.

44. A power supply according to claim 42 wherein airflow from said air inlet crosses most of said primary circuit before crossing said transformer.

45. A power supply according to claim 42 wherein said secondary circuit comprises:

a component requiring conduction cooling mounted on said principal bulwark to conduct heat thereto, so that said principal bulwark acts as a heat sink.

46. A power supply according to claim 42 comprising:

a gasket peripherally mounted alongside said principal bulwark between said principal bulwark and said case.

47. A power supply according to claim 42 comprising:

an auxiliary bulwark mounted in said case, said principal bulwark and said auxiliary bulwark internally dividing said case into three air chambers.

48. A power supply according to claim 47 wherein said principal bulwark and said auxiliary bulwark are electrically isolated.

49. A power supply according to claim 48 wherein said converter means comprises:

a main power transformer;

a primary circuit having a primary component for driving said transformer; and a secondary circuit having a secondary component coupled to and driven by said transformer, said primary component and said secondary component being mounted on separate ones of said auxiliary bulwark and said principal bulwark for dissipating heat.

50. A power supply according to claim 49 wherein said primary component comprises a power switch, said secondary component comprising a rectifier.

51. A power supply adapted to be driven by a primary power source to produce an output voltage, comprising:

a case having a lower wall, an air inlet, an air outlet, and an enclosed chamber bordered by said lower wall, said air inlet and said air outlet;

converter means mounted in said case and adapted to be connected to said primary power source for producing said output voltage;

a fan mounted in said case between said air inlet and said air outlet for providing a pair of airflows downstream and upstream of said fan;

a principal bulwark mounted in said case for (a) dividing said chamber, (b) supporting said fan, and (c) impeding bypassing of said fan; and an auxiliary bulwark mounted in said case, said principal bulwark and said auxiliary bulwark internally dividing said case into three air chambers, said principal bulwark and said auxiliary bulwark being electrically isolated, said converter means comprising:

a main power transformer mounted between said principal bulwark and said auxiliary bulwark;

a primary circuit having a primary component for driving said transformer; and a secondary circuit having a secondary component coupled to and driven by said transformer, said primary component and said secondary component being mounted on separate ones of said auxiliary bulwark and said principal bulwark for dissipating heat.

52. A power supply adapted to be driven by a primary power source to produce an output voltage, comprising:

a case having a lower wall, an air inlet, an air outlet, and an enclosed chamber bordered by said lower wall, said air inlet and said air outlet;

converter means mounted in said case and adapted to be connected to said primary power source for producing said output voltage;

a fan mounted in said case between said air inlet and said air outlet for providing a pair of airflows downstream and upstream of said fan;

a principal bulwark mounted in said case for (a) dividing said chamber, (b) supporting said fan, and (c) impeding bypassing of said fan; and an auxiliary bulwark mounted in said case, said principal bulwark and said auxiliary bulwark internally dividing said case into three air chambers, said principal bulwark and said auxiliary bulwark being electrically isolated, said converter means comprising:

a main power transformer;

a primary circuit having a primary component for driving said transformer; and a secondary circuit having a secondary component coupled to and driven by said transformer, said primary component and said secondary component being mounted on separate ones of said auxiliary bulwark and said principal bulwark for dissipating heat, said primary component comprising a power switch mounted on said auxiliary bulwark, said secondary component comprising a rectifier mounted on said principal bulwark.

* * * * *